United States Patent
Harada (10) Patent No.: US 10,861,880 B2
(45) Date of Patent: Dec. 8, 2020

(54) ELECTRONIC DEVICE AND MANUFACTURING METHOD THEREFOR

(71) Applicant: Japan Display Inc., Minato-ku (JP)

(72) Inventor: Keisuke Harada, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 16/166,201

(22) Filed: Oct. 22, 2018

(65) Prior Publication Data

US 2019/0131319 A1 May 2, 2019

(30) Foreign Application Priority Data

Oct. 27, 2017 (JP) .................................. 2017-208380

(51) Int. Cl.
*H01L 27/12* (2006.01)

(52) U.S. Cl.
CPC ........ *H01L 27/124* (2013.01); *H01L 27/1248* (2013.01); *H01L 27/1255* (2013.01)

(58) Field of Classification Search
None
See application file for complete search history.

(56) References Cited

U.S. PATENT DOCUMENTS

| 2003/0094615 | A1* | 5/2003 | Yamazaki | H01L 27/12 257/72 |
| 2008/0143912 | A1* | 6/2008 | Kim | G02F 1/13624 349/48 |
| 2011/0241219 | A1* | 10/2011 | Nakazawa | G02F 1/13454 257/774 |
| 2014/0014979 | A1* | 1/2014 | Matsumoto | H01L 33/0041 257/88 |
| 2017/0243772 | A1* | 8/2017 | Oh | B32B 37/025 |
| 2017/0250372 | A1* | 8/2017 | Tojo | H01L 51/5253 |
| 2018/0342536 | A1* | 11/2018 | Suzumura | G02F 1/1368 |
| 2018/0348560 | A1* | 12/2018 | Uchida | G02F 1/1368 |

FOREIGN PATENT DOCUMENTS

JP 2017-152330 8/2017

* cited by examiner

*Primary Examiner* — Steven M Christopher
(74) *Attorney, Agent, or Firm* — Oblon, McClelland, Maier & Neustadt, L.L.P.

(57) ABSTRACT

An electronic device has a multilayer structure including a plurality of wires in multiple layers, and a conductive material on a surface of the multilayer structure for electrically connecting two or more wires included in the plurality of wires. The surface of the multilayer structure has a first recess. The conductive material is in the first recess and on the surface of the multilayer structure. The conductive material has an upper surface. The upper surface has a second recess corresponding to the first recess. The second recess has a bottom surface at a higher position than an upper surface of the uppermost layer of the two or more wires.

15 Claims, 9 Drawing Sheets

ELECTRONIC DEVICE AND MANUFACTURING METHOD THEREFOR

CROSS-REFERENCE TO RELATED APPLICATION

The present application claims priority from Japanese application JP2017-208380 filed on Oct. 27, 2017, the content of which is hereby incorporated by reference into this application.

BACKGROUND

This relates to electronic devices and manufacturing method therefor.

Electronic devices have a circuit layer in a multilayer structure where wires and insulation layers are alternately laminated (JP 2017-152330A). Upper and lower wires are electrically connected through contact holes in an insulation layer. The contact holes are formed by etching. The contact holes, which penetrate multiple layers, may be formed all at once in fewer steps.

Providing a conductive material in the contact hole in a way of material deposition such as sputtering arises a concern of electrical contact failure, due to difficulty in depositing the material on an upright internal surface. Or, the insulation layer may have wires extending thereover and thereunder and have an uneven surface formed due to the wire running thereunder, making it difficult for the material to be deposited thereon because of the unevenness, causing a break in the wire over the uneven surface of the insulation layer.

SUMMARY

This is to prevent wires from being inferior.

An electronic device may have a multilayer structure including a plurality of wires in multiple layers, and a conductive material on a surface of the multilayer structure for electrically connecting two or more wires included in the plurality of wires. The surface of the multilayer structure has a first recess. The conductive material is in the first recess and on the surface of the multilayer structure. The conductive material has an upper surface. The upper surface has a second recess corresponding to the first recess. The second recess has a bottom surface at a higher position than an upper surface of the uppermost layer of the two or more wires.

The second recess in the upper surface of the conductive material has a bottom higher than the upper surface of the uppermost layer among the two or more wires, limiting possibility of fracture, preventing the wires from being inferior.

A method for manufacturing an electronic device may include forming a multilayer structure that includes wires in multiple layers and has a first recess on a surface and may include providing a conductive material in one of paste, liquid, and gel forms, on the surface of the multilayer structure and in the first recess, for electrically connecting two or more wires included in the wires. The conductive material is provided to have a second recess on an upper surface corresponding to the first recess and to have a bottom surface of the second recess at a higher position than an upper surface of the uppermost layer of the two or more wires.

The second recess in the upper surface of the conductive material has a bottom higher than the upper surface of the uppermost layer among the two or more wires, limiting possibility of fracture, preventing the wires from being inferior.

DETAILED DESCRIPTION

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment

Figure 1:
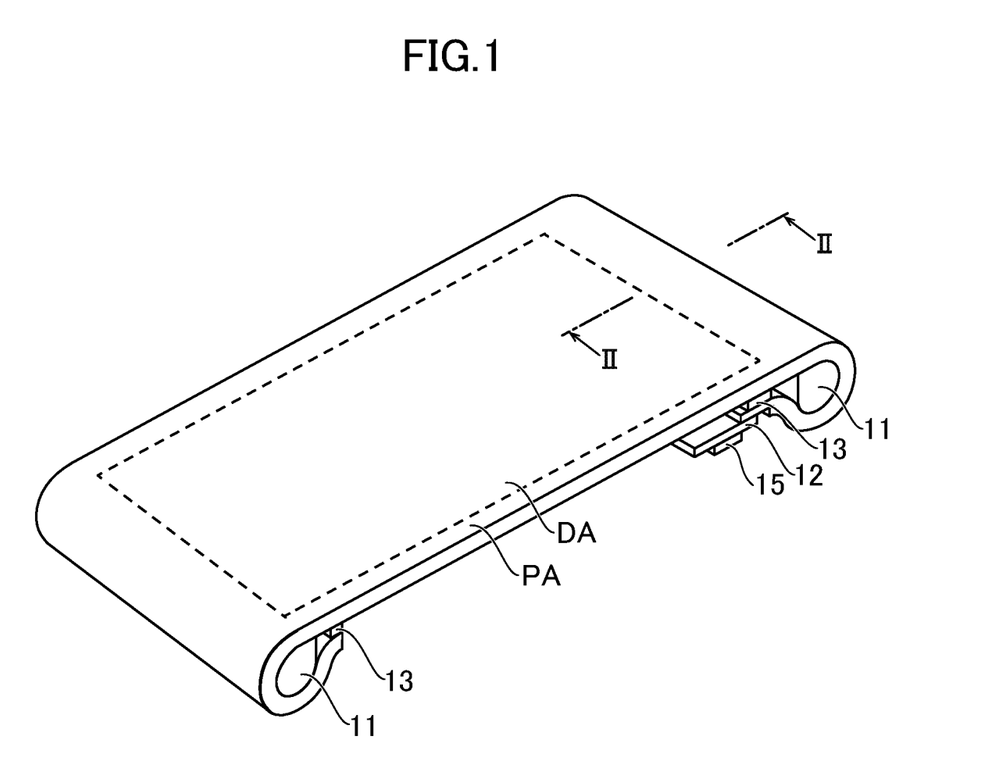
FIG. 1 is a perspective view of a first embodiment of an electronic device.

FIG. 1 is a perspective view of a first embodiment of an electronic device. The electronic device is a display device, specifically an organic electroluminescence (EL) display device. The display device is configured to display a full-color image by forming full-color pixels, each of which consists of unit pixels (subpixels) in some colors such as red, green, and blue. The display device includes a display area DA and a peripheral area PA around the display area DA. The peripheral area PA is outside the display area DA. A flexible printed circuit board 12 is connected to the peripheral area PA. The flexible printed circuit board 12 has an integrated circuit 15 mounted thereon for controlling an element to display the image.

The electronic device curves at its edge (e.g. both edges). FIG. 1 illustrates an example where the display area DA has an elongated shape in one direction such as a rectangle and curves at least one of the both edges along a longer direction or alternatively curves at least one of other both edges along a shorter direction. The example in FIG. 1 has the peripheral area PA at its edge curved and the display area DA at its edge curved as well, or only the peripheral area PA may curve without curvature of the display area DA. A spacer 11 is inside the curvature to prevent the curvature from being too large. To keep the curvature, the edge is attached inside the curvature with a pressure-sensitive adhesive 13.

Figure 2:
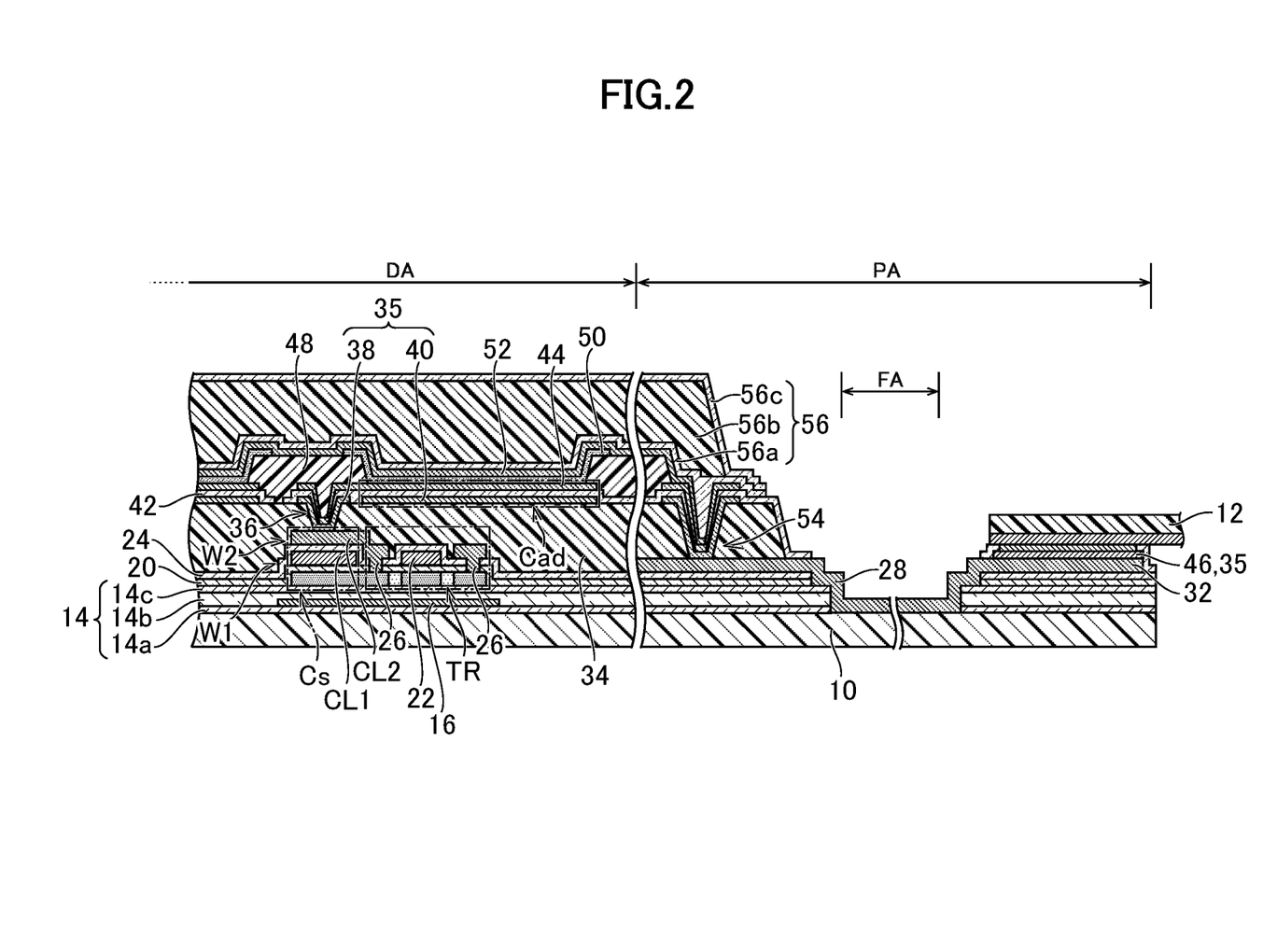
FIG. 2 is a II-II line developed cross-section view of the electronic device in FIG. 1.

FIG. 2 is a II-II line developed cross-section view of the electronic device in FIG. 1. The substrate (array substrate) and another substrate (unillustrated counter substrate) are made from materials such as polyimide. Or, other resin materials may be used as long as the materials have enough flexibility for a sheet display or a flexible display.

A three-layer laminate structure, consisting of a silicon oxide film 14a, a silicon nitride film 14b, and a silicon oxide film 14c, is on the substrate 10 for an undercoat layer 14. The silicon oxide film 14a in the lowest layer is for improving a close-fitting property with the substrate 10; the silicon nitride film 14b in the middle layer is for a blocking film from external moisture and impurities; the silicon oxide film 14c in the uppermost layer is for another blocking film to prevent hydrogen atoms in the silicon nitride film 14b from diffusing on a side of a semiconductor layer 18 of a thin film transistor TR. Such a structure, however, is not essential. Another layer may be laminated, and a single layer or a double-layer structure is applicable thereto.

An additional film 16 may be formed under the undercoat layer 14 to correspond to an area where the thin film transistor TR is formed. The additional film may curb a characteristic change of the thin film transistor TR due to light intrusion from its channel back or may provide the thin film transistor TR with a backgating effect by being formed from a conductive material to apply a certain potential. In this embodiment, after the silicon oxide film 14a is formed, the additional film 16 is formed in an island shape corresponding to an area where the thin film transistor TR is formed, and then the silicon nitride film 14b and the silicon oxide film 14c are laminated, whereby the additional film 16 is sealed in the undercoat layer 14. Alternatively, the undercoat layer 14 may be made after the additional film 16 is formed on the substrate 10.

The thin film transistor TR is on the undercoat layer 14. A polysilicon thin film transistor is illustrated and only an N-channel transistor is herein shown but a P-channel transistor may be simultaneously formed. The semiconductor layer 18 in the thin film transistor TR has a structure where a low-concentration impurity area is provided between a channel area and a source/drain area. A silicon oxide film is herein used for a gate insulation film 20. A gate electrode 22 is a part of a first wire layer W1 made from MoW. The first wire layer W1 includes a first storage capacitor line CL1 in addition to the gate electrode 22. A part of a storage capacitor Cs is formed between the first storage capacitor line CL1 and the semiconductor layer 18 (source/drain area), with the gate insulation film 20 interposed therebetween.

An interlayer dielectric 24 (silicon oxide film and silicon nitride film) is on the gate electrode 22. At least a part of the interlayer dielectric 24 is removed to make the substrate 10 more flexible and foldable at a folding area FA. Removing the part of the interlayer dielectric 24 exposes the undercoat layer 14, at least a part of which is also removed by patterning. After removing the part of the undercoat layer 14, polyimide constituting the substrate 10 is exposed. The etching of the undercoat layer 14 may partially etch its polyimide surface and reduce its thickness.

A second wire layer W2, which includes portions for the source/drain electrode 26 and a leading line 28, is on the interlayer dielectric 24. A three-layer laminate structure made of Ti, Al, and Ti is herein employed. The first storage capacitor line CL1 (part of the first wire layer W1) and a second storage capacitor line CL2 (part of the second wire layer W2) constitute another portion of the storage capacitor Cs, with the interlayer dielectric 24 interposed therebetween. The leading line 28 extends to an edge of the substrate 10 and has a terminal 32 for being connected to the flexible printed circuit board 12.

A planarization layer 34 covers the source/drain electrode 26 and the leading line 28 (except for some of their portions). Organic materials such as photosensitive acrylic are often used for the planarization layer 34 because of superior surface flatness, compared with inorganic insulation materials formed by chemical vapor deposition (CVD).

The planarization layer 34 is removed at a pixel contact portion 36 and in the peripheral area PA and has an indium tin oxide film 35 formed thereon. The indium tin oxide film 35 includes a first transparent conductive film 38 and a second transparent conductive film 40 separated from each other.

The second wire layer W2, which has its surface exposed by removing the planarization layer 34, is covered with the first transparent conductive film 38. A silicon nitride film 42 is on the planarization layer 34, covering the first transparent conductive film 38. The silicon nitride film 42 has an opening at the pixel contact portion 36. A pixel electrode 44 is laminated on and connected to the source/drain electrode 26 through the opening. The pixel electrode 44 is a reflective electrode, with a three-layer laminate structure consisting of an indium zinc oxide film, an Ag film, and an indium zinc oxide film. Instead of the indium zinc oxide film, an indium tin oxide film may be used. The pixel electrode 44 extends laterally from the pixel contact portion 36 to above the thin film transistor TR.

The second transparent conductive film 40 is adjacent to the pixel contact portion 36 and under the pixel electrode 44 (further under the silicon nitride film 42). The second transparent conductive film 40, the silicon nitride film 42, and the pixel electrode 44 overlap with one another, whereby an additional capacitance Cad is formed.

The terminal 32 has its surface, on which a third transparent conductive film 46 is formed for another part of the indium tin oxide film 35. The third transparent conductive film 46 is formed simultaneously with the first transparent conductive film 38 and the second transparent conductive film 40. The third transparent conductive film 46 on the terminal 32 is formed for purposes, one of which is to form a barrier film not to damage the exposed portion of the terminal 32 in a subsequent process. While the pixel electrode 44 is being patterned, the third transparent conductive film 46 is subject to etching environment. The indium tin oxide film 35 secures sufficient resistance to etching of the pixel electrode 44, owing to annealing carried out from the time when the indium tin oxide film 35 is formed and until the pixel electrode 44 is formed.

An insulation layer 48, which called a bank (rib) for a partition of adjacent pixel areas, is on the planarization layer 34 and at the pixel contact portion 36, for example. Photosensitive acrylic may be used for the insulation layer 48 just like the planarization layer 34. The insulation layer 48 has an opening for exposing a surface of the pixel electrode 44 as a light emitting region. The opening preferably has an edge in a gently declined shape. A steep shape of the opening edge may cause insufficient coverage of an organic electroluminescence (EL) layer 50 formed thereon.

The planarization layer 34 and the insulation layer 48 are in contact with each other through an opening in the silicon nitride film 42 between them. This makes it possible to remove moisture and gas desorbed from the planarization layer 34 through the insulation layer 48 during heat treatment after the insulation layer 48 is formed.

An organic EL layer 50 is made from organic materials and is laminated on the pixel electrode 44. The organic EL layer 50 may be a single layer or may have a structure where a hole transport layer, a light emitting layer, and an electron transport layer are laminated, in order from the pixel electrode 44. These layers may be formed by vapor deposition, by solvent dispersion and application, by selective formation for the pixel electrode 44 (each sub-pixel), or by overall formation over the display area DA. The overall formation may be used for a structure where every sub-pixel emits white light and a desired color wavelength portion thereof passes through a color filter (not shown).

A counter electrode 52 is on the organic EL layer 50. Due to a top emission structure herein employed, the counter electrode 52 is transparent. A Mg layer and an Ag layer may be formed to be a thin film through which outgoing light from the organic EL layer 50 can pass. In comply with the forming order of the organic EL layer 50, the pixel electrode 44 is an anode and the counter electrode 52 is a cathode. The counter electrode 52 is formed over the display area DA, extends to a cathode contact portion 54 next to the display area DA, and is connected to the leading line 28 under the cathode contact portion 54 to be electrically connected to the terminal 32.

A sealing film 56 is on the counter electrode 52. The sealing film 56 may serve to prevent external moisture intrusion into the organic EL layer 50 formed thereunder, necessitating high gas barrier property. A silicon nitride film 56a, an organic resin layer 56b, and a silicon nitride film 56c are laminated to constitute a laminate structure including a silicon nitride film. A silicon oxide film or an amorphous silicon layer may be formed between the silicon nitride films 56a, 56c and the organic resin layer 56b for improving close-fitting property, for example.

A cover glass or a touch panel substrate may be provided on the sealing film 56, if necessary. In this case, filler such as resin may be used for filling a gap between the sealing film 56 and the cover glass or the touch panel substrate.

Figure 3:
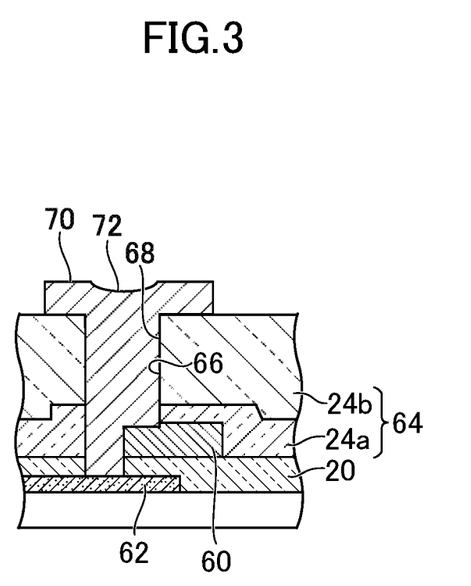
FIG. 3 is an enlarged partial cross-sectional view of the electronic device.

FIG. 3 is an enlarged partial cross-sectional view of the electronic device. The electronic device has a multilayer structure. The multilayer structure includes a first wire 60. The first wire 60 is a part of the first wire layer W1 in FIG. 2. The multilayer structure includes a second wire 62. The second wire 62 is composed of a semiconductor layer in which highly concentrated impurities are added. The semiconductor layer made conductive by n-type impurities added therein is advantageous for application of low voltage, whereas the semiconductor layer made conductive by p-type impurities added therein is advantageous for application of high voltage. The first wire 60 is in the same layer as the semiconductor layer 18 of the thin film transistor TR in FIG. 2.

A gate insulation film 20 may be interposed between the first wire 60 and the second wire 62. An insulation layer 64 covers the first wire 60. The insulation layer 64 may be the silicon oxide film 24a and the silicon nitride film 24b, which constitute the interlayer dielectric 24 in FIG. 2. The uppermost layer of the multilayer structure is the insulation layer 64. A surface of the multilayer structure has a first recess 66.

The first recess 66 is a contact hole penetrating the multilayer structure. The insulation layer 64 has an opening 68, which is a part of the first recess 66.

The electronic device includes a conductive material 70. The conductive material 70 is electrically connected to two or more wires (first wire 60 and second wire 62) included in wires. The first wire 60 and the second wire 62 are in different layers. The uppermost layer (first wire 60) of the connected two or more wires has at least one (both in the example) of a side surface (side) and an upper surface, which are exposed inside the first recess 66 and in contact with the conductive material 70. The lowest layer (second wire 62) of the two or more wires constitutes at least part (whole in the example) of a bottom surface of the first recess 66. The second wire 62 has at least one of a side surface and an upper surface (upper surface in the example) that are exposed inside the first recess 66 and in contact with the conductive material 70.

The conductive material 70 is on the surface of the multilayer structure. The conductive material 70 is in the first recess 66 and on the surface of the multilayer structure. The upper surface of the conductive material 70 has a second recess 72 corresponding to the first recess 66. The bottom surface of the second recess 72 is at a position higher than the upper surface of the uppermost layer (first wire 60) of the two or more wires. The second wire layer W2 may be entirely formed of the conductive material 70 since the conductive material 70 is formed in the same layer as the source/drain electrode 26 in FIG. 2.

With the embodiment, the second recess 72 in the upper surface of the conductive material 70 has a bottom higher than the upper surface of the uppermost layer (first wire 60) among the two or more wires, limiting possibility of fracture, preventing the wires from being inferior.

Manufacturing the electronic device includes forming the multilayer structure with the first recess on its surface. To electrically connect the first wire 60 and the second wire 62, the conductive material in paste, liquid, or gel form is provided on the surface of the multilayer structure and in the first recess 66. The conductive material 70 is made from any one of a conductive polymer, a conductive paste, and a conductive ink. The conductive polymer is polymeric material with charge transport function in molecules, such as PEDOT: PSS [poly (3,4-ethylenedioxythiophene): poly (4-styrenesulfonate)]. The conductive paste includes metal nanoparticles dispersed in medium; the conductive material 70 is provided by heat treatment after application, whereby the medium is removed and the metal nanoparticles are left. Gold nano paste (Au nanoparticles) or silver nano paste (Ag nanoparticles) are its examples. The conductive material 70 is provided to have the second recess 72 in its upper surface corresponding to the first recess 66 and to have the bottom surface of the second recess 72 higher than the upper surface of the first wire 60.

Figure 4:
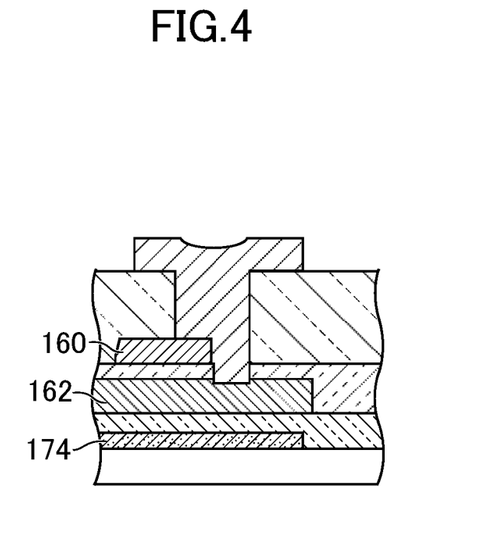
FIG. 4 is a diagram of a variation 1 of the electronic device in FIG. 3.

FIG. 4 is a diagram of a variation 1 of the electronic device in FIG. 3. In the example, the first wire 160, the second wire 162, and the third wire 174 are in respective positions. The first wire 160, among wires included in the multilayer structure, is in the uppermost layer. What is explained in the embodiment is applied to connection between the first wire 160 in the uppermost layer and the second wire 162 in the second uppermost layer but is not applied to the third wire 174 in the lowest layer.

Figure 5:
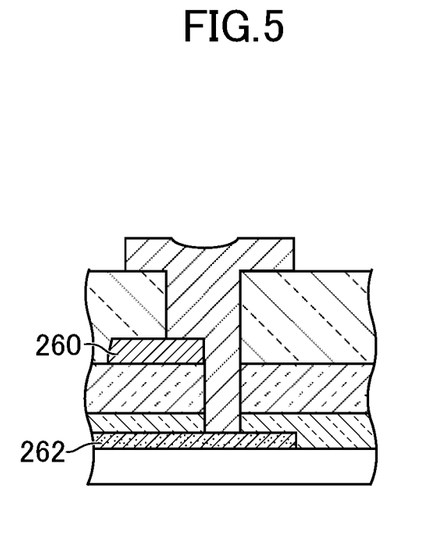
FIG. 5 is a diagram of a variation 2 of the electronic device in FIG. 3.

FIG. 5 is a diagram of a variation 2 of the electronic device in FIG. 3. In the example, the content in the embodiment is applied to connection between the first wire 260 in the uppermost layer and the second wire 262 in the lowest layer.

Figure 6:
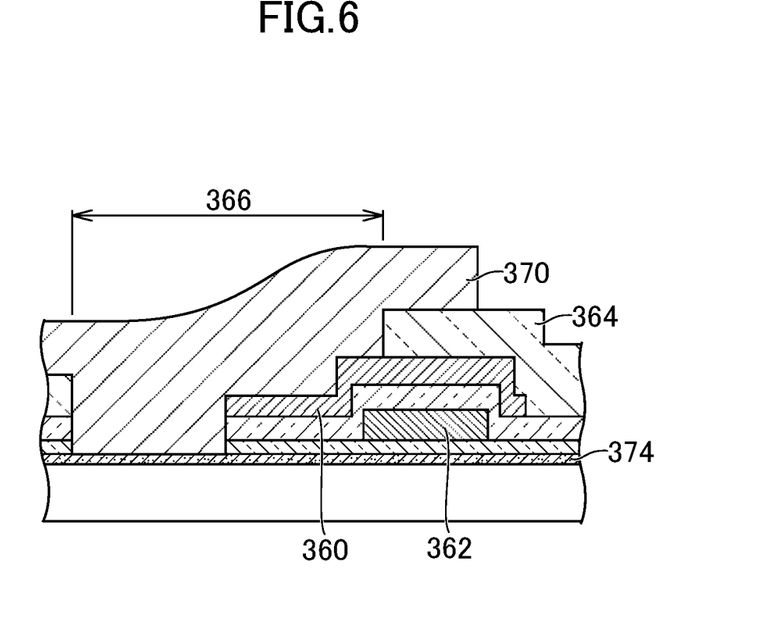
FIG. 6 is a diagram of a variation 3 of the electronic device in FIG. 3.

FIG. 6 is a diagram of a variation 3 of the electronic device in FIG. 3. In the example, the insulation layer 364 in the uppermost layer of the multilayer structure has a portion overlapping with the first wire 360 and the second wire 362 and has another portion not overlapping with them, therefor having unevenness. With the first recess 366 between them, the upper surface of the conductive material 370 also has unevenness. The conductive material 370 is electrically connected to not only the first wire 360 and the second wire 362 but also the third wire 374 under them.

Second Embodiment

Figure 7:
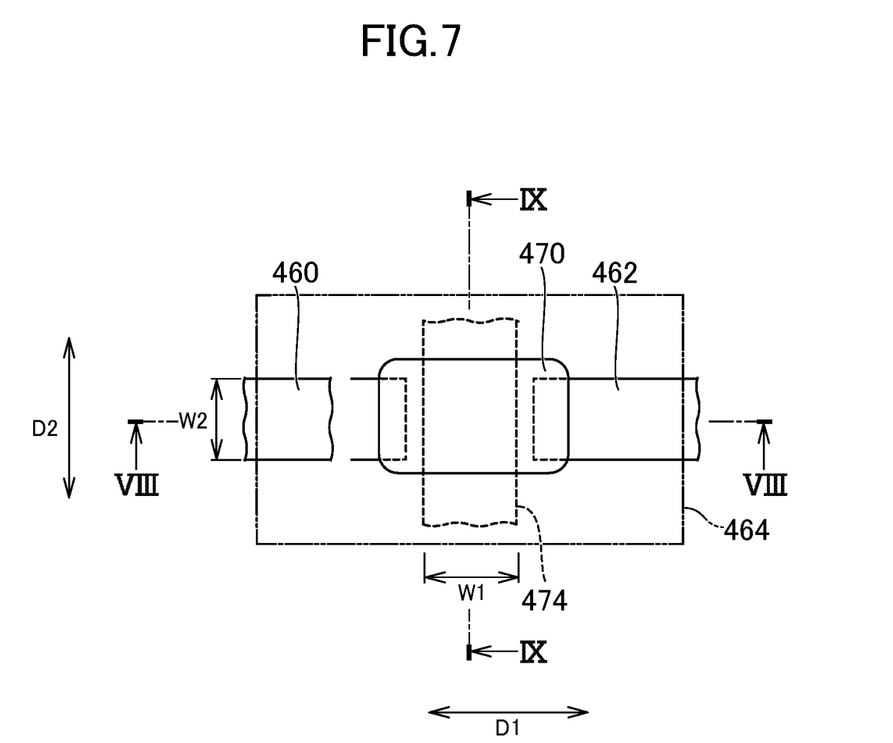
FIG. 7 is an enlarged partial view of a second embodiment of the electronic device.
Figure 8:
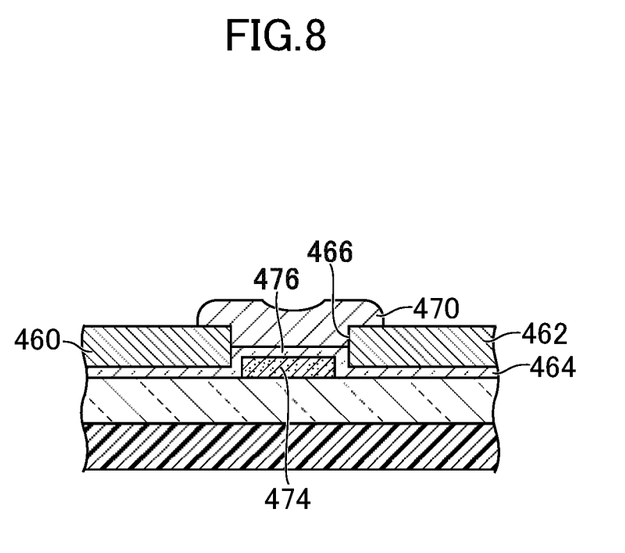
FIG. 8 is a VIII-VIII line cross-sectional view of the structure in FIG. 7.
Figure 9:
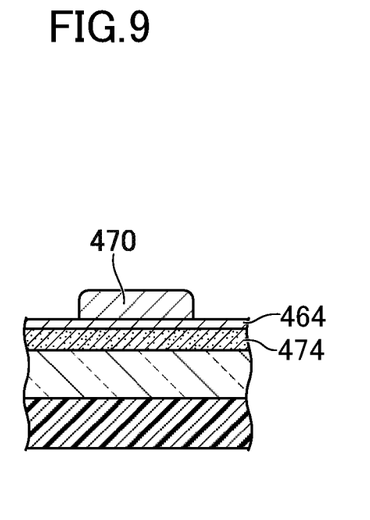
FIG. 9 is a IX-IX line cross-sectional view of the structure in FIG. 7.

FIG. 7 is an enlarged partial view of a second embodiment of the electronic device. FIG. 8 is a VIII-VIII line cross-sectional view of the structure in FIG. 7. FIG. 9 is a IX-IX line cross-sectional view of the structure in FIG. 7.

The two or more wires (first wire 460 and second wire 462) are in the same layer and in the uppermost layer of the wires. The first wire 460 and the second wire 462 are opposed to each other with their tips spaced apart. The first wire 460 and the second wire 462 extend in opposite directions along the first direction D1. The first recess 466 is formed between the opposed tips of the first wire 460 and the second wire 462.

The bottom surface of the first recess 466 is a part of the insulation layer 464. The third wire 474 runs under the insulation layer 464 and under the first recess 466. The third wire 474 extends in the second direction D2 crossing (e.g. perpendicular to) the first direction D1. The insulation layer 464 has a projection 476 extending in the second direction D2 on its surface owing to the third wire 474 under it. The first wire 460 and the second wire 462 do not overlap with the projection 476. The tips of the first wire 460 and the second wire 462 are adjacent to both sides of the projection 476.

As shown in FIG. 7, the conductive material 470 extends beyond the overall width W2 of the first wire 460 and the second wire 462 along the second direction D2, extending beyond the overall width W1 of the third wire 474 along the first direction D1. The conductive material 470 is provided in the folding area FA as shown in FIG. 2. The multilayer structure is provided in the folding area FA of the flexible substrate 10 (FIG. 2).

The electronic device is not limited to the organic electroluminescence display device but may be a display device with a light emitting element disposed in each pixel, such as a quantum-dot light emitting diode (QLED), or a liquid crystal display device.

While there have been described what are at present considered to be certain embodiments, it will be understood that various modifications may be made thereto, and it is intended that the appended claims cover all such modifications as fall within the true spirit and scope of the invention.

What is claimed is:

1. An electronic device comprising:
   a substrate;
   a multilayer structure including a plurality of wires in multiply stacked layers on the substrate;
   a first recess in the multilayer structure; and
   a conductive material for electrically connecting two or more wires included in the plurality of wires,
   wherein each of surfaces of the two or more wires is exposed in the first recess,
   the conductive material is in the first recess and on the surface of the multilayer structure,
   the conductive material is in contact with the each of surfaces of the two or more wires in the first recess,
   the conductive material has an upper surface,
   the upper surface includes a second recess that overlaps with the first recess in a direction defined from the substrate to the wires, and
   a minimum distance between a bottom surface of the second recess and the substrate is larger than a minimum distance between an upper surface of the uppermost layer of the two or more wires and the substrate.

2. The electronic device according to claim 1, wherein the first recess is a contact hole, and
   the two or more wires are in respective different layers from each other.

3. The electronic device according to claim 2, wherein at least the lowest layer of the two or more wires has at least one of a side surface and an upper surface that are exposed inside the first recess and are in contact with the conductive material.

4. The electronic device according to claim 2, wherein the lowest layer of the two or more wires constitutes at least a part of a bottom surface of the first recess.

5. The electronic device according to claim 2, wherein the uppermost layer of the two or more wires is the uppermost layer of the plurality of wires.

6. The electronic device according to claim 5, wherein the uppermost layer of the two or more wires has at least one of a side surface and an upper surface that are exposed inside the first recess and are in contact with the conductive material.

7. The electronic device according to claim 2, wherein the uppermost layer of the multilayer structure is an insulation layer, and
   the insulation layer includes an opening constituting a part of the first recess.

8. The electronic device according to claim 1, wherein the two or more wires are in the uppermost layer of the plurality of wires and have respective tips opposed to each other with the first recess interposed therebetween.

9. The electronic device according to claim 8, wherein the first recess has a bottom surface made of an insulation layer.

10. The electronic device according to claim 9, wherein the two or more wires include a first wire and a second wire that extend in opposite directions along a first direction,
    the plurality of wires run under the insulation layer and under the first recess, the plurality of wires including a third wire extending in a second direction crossing the first direction, and
    the insulation layer on a surface has a projection owing to the third wire disposed thereunder, the projection extending in the second direction.

11. The electronic device according to claim 10, wherein the two or more wires do not overlap with the projection.

12. The electronic device according to claim 11, wherein the two or more wires have the respective tips adjacent to both sides of the projection.

13. The electronic device according to claim 10, wherein the conductive material is provided to exceed an overall width of the first wire and the second wire in a direction perpendicular to the first direction and to exceed an overall width of the third wire in a direction perpendicular to the second direction.

14. The electronic device according to claim 1, wherein the substrate has flexibility and a folding area,
the multilayer structure is on the substrate, and
the conductive material is on the folding area.

15. The electronic device according to claim 1, wherein the conductive material is one of a conductive polymer, a conductive paste, and a conductive ink.

* * * * *